(12) United States Patent
Gottlieb et al.

(10) Patent No.: US 8,653,720 B2
(45) Date of Patent: Feb. 18, 2014

(54) SOLID STATE BENDING ACTUATOR COMPRISING AN EXTENSION ELEMENT

(75) Inventors: Bernhard Gottlieb, München (DE); Andreas Kappel, Brunnthal (DE); Tim Schwebel, München (DE); Carsten Wallenhauer, Schwarzheide (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 12/601,189

(22) PCT Filed: May 6, 2008

(86) PCT No.: PCT/EP2008/055559
§ 371 (c)(1),
(2), (4) Date: Mar. 16, 2010

(87) PCT Pub. No.: WO2008/141925
PCT Pub. Date: Nov. 27, 2008

(65) Prior Publication Data
US 2010/0164327 A1     Jul. 1, 2010

(30) Foreign Application Priority Data
May 21, 2007   (DE) .......................... 10 2007 023 549

(51) Int. Cl.
*H01L 41/08*     (2006.01)
(52) U.S. Cl.
USPC ....................................................... 310/330
(58) Field of Classification Search
USPC ................................. 310/330–332
See application file for complete search history.

(56) References Cited

U.S. PATENT DOCUMENTS

| | | | |
|---|---|---|---|
| 3,821,747 A * | 6/1974 | Mason | 346/62 |
| 4,093,883 A * | 6/1978 | Yamamoto | 310/317 |
| 4,112,279 A * | 9/1978 | Brohard | 200/181 |
| 4,403,166 A * | 9/1983 | Tanaka et al. | 310/332 |
| 5,068,567 A | 11/1991 | Jones | |
| 5,173,605 A * | 12/1992 | Hayes et al. | 850/1 |
| 5,276,672 A * | 1/1994 | Miyazaki et al. | 369/126 |
| 5,561,337 A | 10/1996 | Toda | |
| 5,828,157 A | 10/1998 | Miki et al. | |
| 5,994,821 A | 11/1999 | Imada et al. | |
| 6,222,302 B1 * | 4/2001 | Imada et al. | 310/321 |
| 2006/0181179 A1 | 8/2006 | Wood et al. | |

FOREIGN PATENT DOCUMENTS

| | | |
|---|---|---|
| EP | 0739083 | 10/1996 |
| JP | 3-222680 A | 10/1991 |

(Continued)

OTHER PUBLICATIONS

Wood R J et al: "Optimal energy density piezoelectric bending acutators" Sensors and Actuators A, vol. 119, No. 2, 2005, pp. 476-488, XP004852190.

*Primary Examiner* — Mark Budd
(74) *Attorney, Agent, or Firm* — Cozen O'Connor

(57) ABSTRACT

A solid state actuator arrangement comprising an actuator which is configured as a solid state bending actuator and which has a first and a second end section opposite each other, a fastening device for fastening the first end section of the actuator in such a manner that it can still be adjusted, and connections for applying a driver signal to the actuator for adjusting the second end section by bending the actuator between at least two positions, an extension element being fastened to the free second end section of the actuator.

6 Claims, 3 Drawing Sheets

(56) References Cited

FOREIGN PATENT DOCUMENTS

| | | |
|---|---|---|
| JP | 6-203351 A | 7/1994 |
| JP | 8-222776 A | 8/1996 |
| JP | 10-192782 A | 7/1998 |
| JP | 10-215009 A | 8/1998 |
| JP | 3235099 B2 | 12/2001 |

* cited by examiner

FIG 1 (fixed end portion)
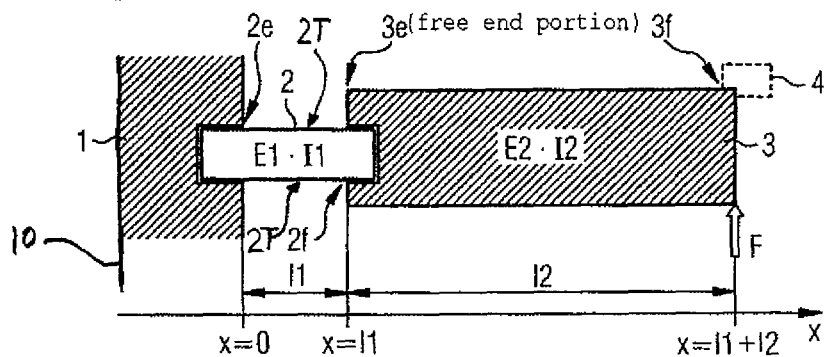
FIG 2
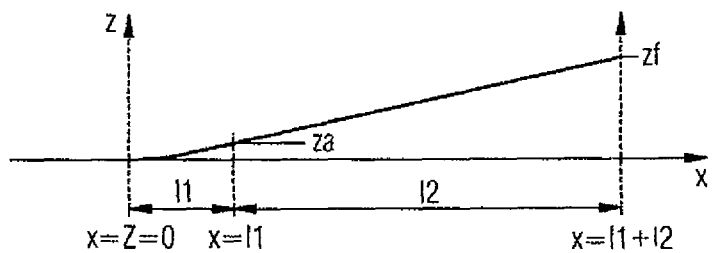
FIG 4
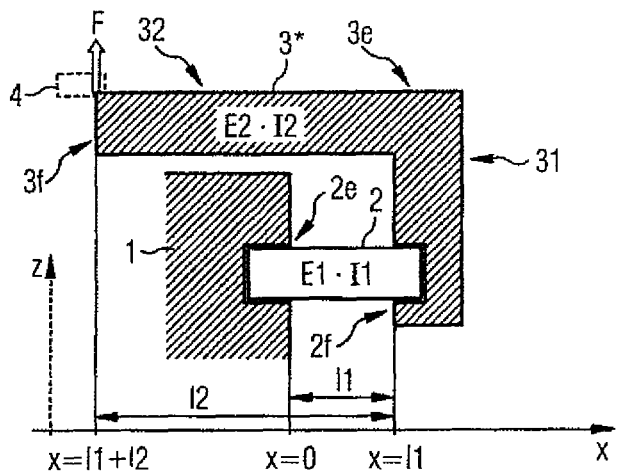

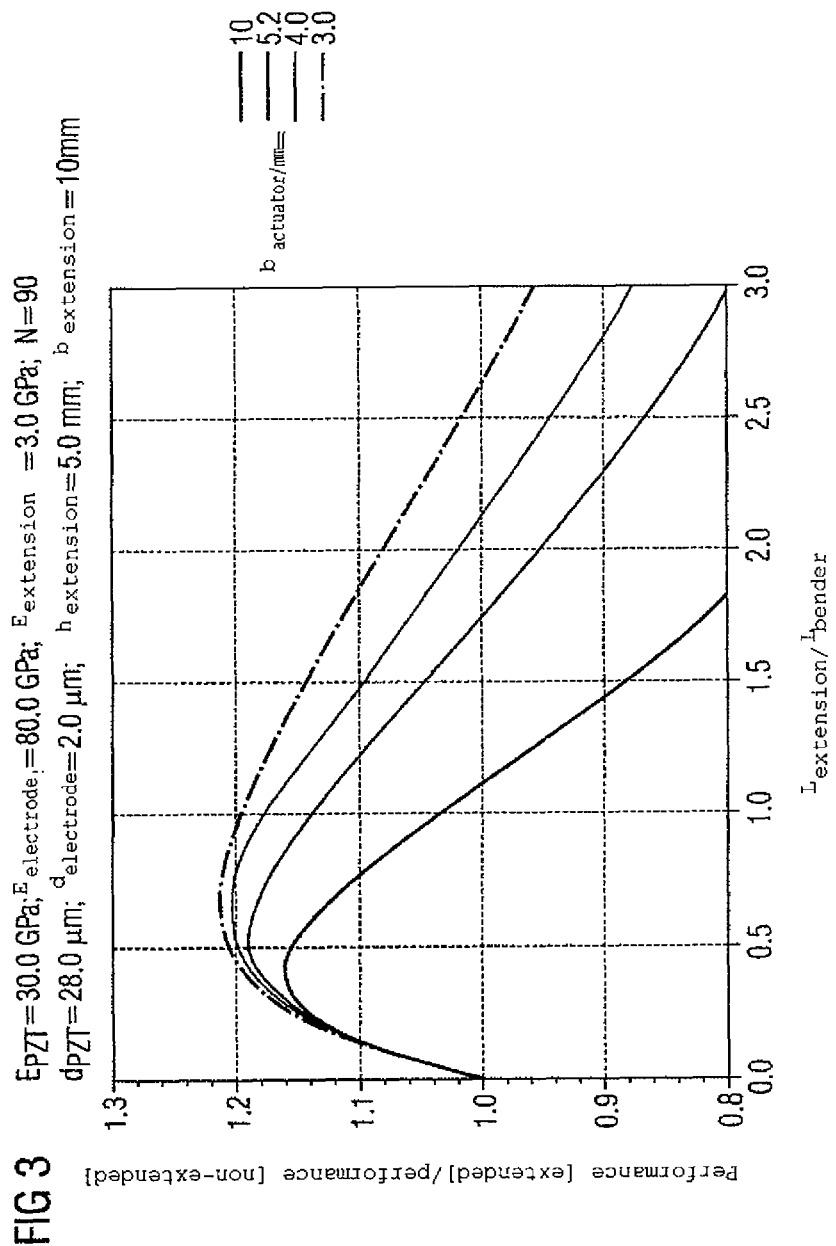

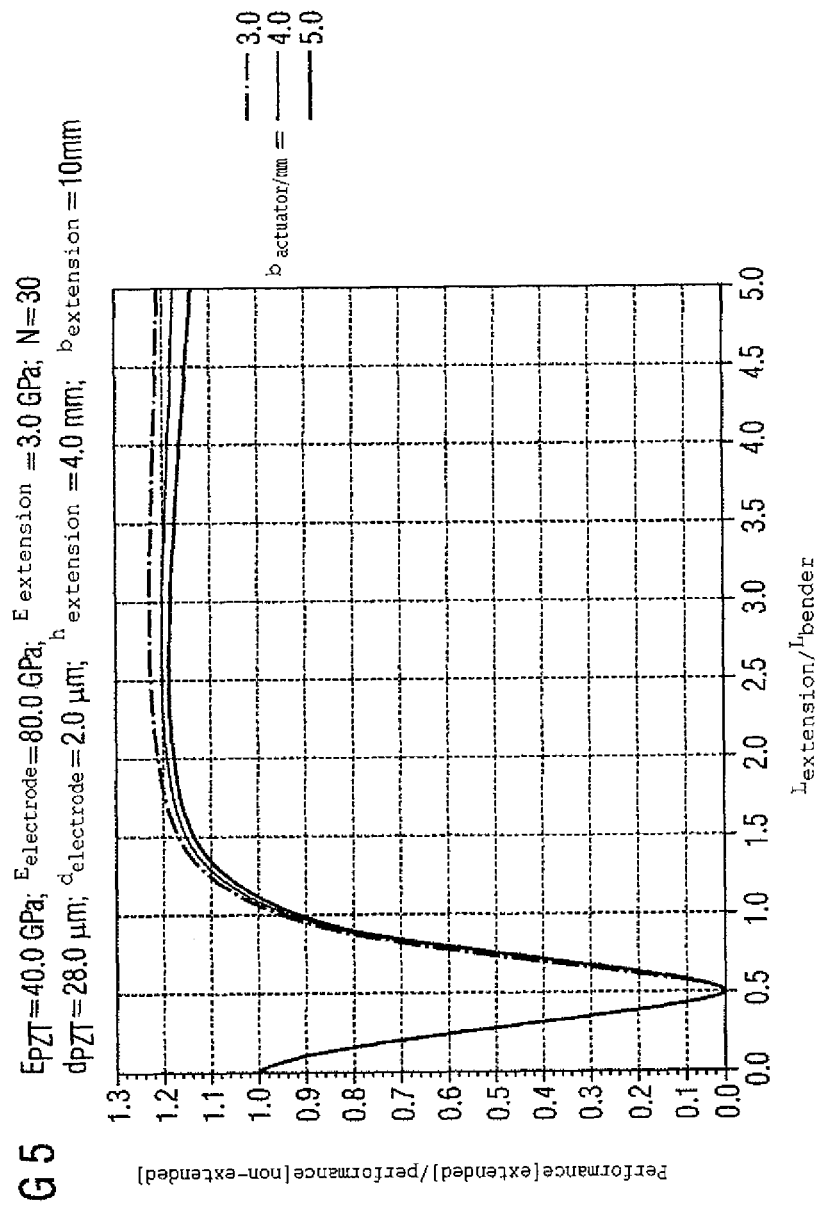

SOLID STATE BENDING ACTUATOR COMPRISING AN EXTENSION ELEMENT

This is a U.S. national stage of application No. PCT/EP2008/055559, filed on 5 Jun. 2008, which claims Priority to the German Application No.: 10 2007 023 549.8, filed: 21 May 2007; the contents of both being incorporated herein by reference.

BACKGROUND OF THE INVENTION

1. Field of the Invention

The invention relates to a solid state actuator arrangement comprising a bending actuator having an extension element fastened to a free end of the actuator.

2. Prior Art

A solid state actuator arrangement comprising an actuator, designed as a solid state bending actuator, is known in general. The actuator has, opposite one another, a first and a second end portion. Moreover, the solid state actuator arrangement comprises a fastening device for a misplacement-proof fastening of the first end portion of the actuator to a frame or a housing. Furthermore, the solid state actuator arrangement has a control device or terminals for applying a driver signal to the actuator, so that, by the actuator being bent due to the applied driver signal, the second end portion can be adjusted in relation to the first end portion between at least two positions, in particular continuously adjusted. By the second end portion a switching action can thereby be initiated, or a body can be adjusted or moved in relation to the fastening device and consequently in relation to a frame or housing.

In particular, by a solid state actuator arrangement, a piezoelectric stepping motor, based on piezoelectric bending actuators, can be developed for the drive of indicator instruments in the form of a pointer drive. Indicator instruments of this type may be used as revolution counters, tachometers or temperature indicators as an integral part of a combination instrument for vehicles, in particular passenger cars, motor trucks or motor boats. Accordingly, solid state actuator arrangements of this type are mass products subject to stringent cost constraints.

In the case of stepping motors based on piezoelectric bending actuators as solid state actuators, the cost situation is dominated by the price of the piezoelectric bending actuators which are employed. A rough estimation of costs leads to two proportional relationships. The costs for the bending actuators are directly proportional to their volume. Moreover, the mechanical power of the actuator excited the driver signal is directly proportional to its volume.

Performance data, specified in the product definitions for a stepping motor formed from such a solid state actuator arrangement stipulate the necessary minimum volume of the piezoelectric actuators to be used, this ultimately determining the costs of the stepping motor.

It can be seen from the relationships that high costs for actuators of this type are a disadvantage. On account of the direct relationship between the costs and volume of such an actuator, there is therefore the technical problem of increasing the mechanical power output per actuator volume when such an actuator is activated, so that the costs of manufacturing a solid state actuator arrangement can be lowered to the same extent, since less actuator material has to be used in order to fulfill a given specification.

SUMMARY OF THE INVENTION

An object of the invention is to provide a solid state actuator arrangement comprising a sold state bending actuator, which arrangement makes it possible to have a saving of the material of the actuator or a reduction in the length of the actuator, without causing a reduction in the mechanical power output of the actuator.

This object is achieved by means of a solid state actuator arrangement comprising a bending actuator having an extension element.

In a preferred embodiment, a solid state actuator arrangement comprises an actuator that is designed as a solid state bending actuator and has, opposite one another, a first and a second end portion, with a fastening device for a misplacement-proof fastening of the first end portion of the actuator and with terminals for applying a driver signal to the actuator for the adjustment of the second end portion between at least two positions as a result of the bending of the actuator, an extension element being fastened to the free second end portion of the actuator. In particular, this includes continuous adjustment between the at least two positions.

Advantageously, therefore, part of the costly actuator material can be saved in that the extension element is fastened to the free end of the actuator, the extension element being capable of being produced from a cost-effective rigid material.

A misplacement-proof fastening of the first end portion of the actuator is to be understood as meaning that the actuator is fastened in relation to a housing, such that its free end portion lying opposite the fastening point is adjustable in relation to the fastening portion as a result of the bending of the actuator.

Preferably, the extension element extends from the free end portion of the actuator in a direction of a longitudinal extent of the actuator. In this case an effective length corresponds to a first length of the bendable portion of the actuator, plus a second length, linearly adjoining it, of the extension element.

The extension element of a further embodiment extends with a first extension element portion from the free end portion of the actuator in a direction leading laterally away from the actuator and with a second extension element portion adjoining it redirectionally parallel to a longitudinal extent of the actuator. A redirectionally parallel extent of the second extension element portion is to be understood as meaning an orientation in a first, in particular relaxed, rectilinear position of the actuator. When the actuator is bent out of a rectilinear course, a pivoting of the extension element portion over its entire extent in relation to the fastening point of the actuator on the fastening device takes place.

The second extension element portion in this case preferably extends redirectionally in parallel beyond a point parallel to a fastening point of the first end portion of the actuator on the fastening device.

A rearward length, as an effective length, preferably corresponds to a first length of the bendable portion of the actuator, minus a second length, running parallel thereto, of the second extension element portion. A step-up ratio is in this case determined, in particular, by the value 1 minus the quotient of double the second length divided by the first length.

A free end portion of the extension element is formed, spaced apart from the end portion of the actuator, for adjusting a body to be adjusted with respect to its position in relation to the fastening device.

The extension element is preferably designed as a passive extension element. A passive extension element is understood in this context as meaning an extension element which, when the actuator is excited, in order to bend, is not itself also bent or is not itself varied actively in terms of its configuration, but remains unchanged.

The extension element is preferably designed as rigid an extension element as possible. A rigid extension element is to be understood in this context as meaning an extension element which, under a bending moment acting upon it, is not bent, or at most is bent elastically to a slight extent, during the adjustment of a body to be adjusted via the actuator and the extension element, so that the body to be adjusted can be adjusted in relation to the fastening device.

In addition to solid state actuators, particularly in multilayer PMA type of construction, as piezoelectric actuators, versions with other types of solid state actuators, for example magnetostrictive or electrostrictive solid state actuators, can also be used as actuators.

An exemplary embodiment and a modified embodiment are explained in more detail below by means of the drawing. In this case, identical or identically acting components and functional features are given the same reference symbols. As regards identical or identically acting components and functional features, reference is also made to the description of the other embodiment in each case.

BRIEF DESCRIPTION OF DRAWINGS

In the drawing:

FIG. 1 is a first embodiment of a solid state actuator arrangement comprising a solid state bending actuator as an actuator;

FIG. 2 is a graph to illustrate a bent course of a longitudinal extent of the actuator and of an extension element adjoining it;

FIG. 3 is a performance graph of a non-extended actuator according to the first embodiment, as compared with actuators extended to different lengths;

FIG. 4 is a second embodiment of a solid state actuator arrangement comprising a solid state bending actuator as the actuator; and FIG. 5 is a performance graph of a non-extended actuator according to the second embodiment, as compared with actuators extended to different lengths.

DETAILED DESCRIPTION OF THE DRAWINGS

FIG. 1 is an exemplary solid state actuator arrangement according to a first embodiment, in which a fastening device 1 is illustrated on the left in the drawing. The fastening device 1 may be arranged, misplacement-proof, in a housing or on a frame 10, but may also be configured directly as an integral part of a frame or housing 10.

An actuator, which is designed as a solid state bending actuator 2, is fastened by its first end portion 2e to the fastening device 1. In the embodiment illustrated, the misplacement-proof fastening of the actuator 2 to the fastening device 1 takes place by the first end portion 2e of the actuator 2 being inserted into a corresponding recess of the fastening device 1. In this case, the actuator 2 may be press-fitted, glued, plastic injection-molded or welded in the recess of the fastening device 1. In principle, any desired fastening possibilities can be used, as long as the first end portion 2e of the actuator 2 remains fixed in position and at a fixed location at the fastening point or fastening region on the fastening device 1 when the actuator is actuated.

The actuator 2 has terminals 2T (shown schematically), for applying a driver signal to the actuator 2, so that a second end portion 2f of the actuator 2 can be adjusted between at least two positions as a result of the bending of the actuator 2 due to the applied driver signal. The second end portion 2f in this case is located on the actuator 2 on an opposite side to the first end portion 2e of the actuator 2. When the driver signal is applied to the actuator 2, the latter is bent about a connecting line between the two end portions 2e, 2f.

An extension element 3 is fastened to the free second end portion 2f of the actuator 2. The fastening of the extension element 3 to the free second end portion 2f of the actuator 2 occurs such that the extension element 3, together with the second end portion 2f of the actuator 2, is adjusted when the second end portion 2f of the actuator 2 is adjusted between the at least two positions.

Preferably, the fastening of the extension element 3 to the second end portion 2f of the actuator 2 takes place such that a first end portion 3e of the extension element 3 is fastened fixedly to the second end portion 2f of the actuator 2. The drawing again illustrates by way of example an arrangement in which the second end portion 2f of the actuator 2 is inserted into a corresponding reception recess in the end face of the first end portion 3e of the extension element 3.

Movement of the free end 2f, causes a second end portion 3f of the extension element 3 to move, such that the solid state actuator arrangement can adjust a body 4 in relation to the fastening device 1. The driver signal is applied to the actuator 2 and bends the actuator 2 such that the second end portion 2f of the actuator 2 adjusts the extension element 3.

In this case an effective length is a first length l1 as a bendable longitudinal extent length of the actuator 2 between the fixing point or fastening point on the fastening device 1 and on the extension element 3 and, in addition, a second length l2 as the length of the extension element 3 between its two end portions 3e, 3f.

FIG. 2 shows by way of example the effect of an applied driver signal on the course of the non-excited actuator 2 and of the extension element 3. In this case, the x-axis represents the course of a wall or other longitudinal line which leads from the fastening point on the fastening device 1 rectilinearly through the actuator 2 and the extension element 3. Ideally, this linear course in this case intersects the cross section of the end portions 2e, 2f of the actuator 2 and of the end portions 3e, 3f of the extension element 3 at right angles. By the driver signal being applied, the actuator 2 is bent, the bend leading to a curved course of the corresponding line which, for example, represents a side wall of the actuator 2. By contrast, the linear course longitudinally through the extension element 2 or along one of its side walls remains linear.

If the extension element were to come to bear directly at the fastening point on the fastening device 1, the resulting movement would correspond to a pivoting in the manner of a lever arm. However, the actuator 2 having the curved course is interposed between the extension element 3 and the fastening device 1 so that no typical lever action in the sense of a lever arm known per se is brought about. According to first calculations and tests, however, an increase in performance is obtained.

FIG. 2 outlines a lateral adjustment z from a zero point x=z=0. Over the comparatively short first length l1 of the actuator 2, lateral adjustment takes place as a result of bending as far as a first adjustment position za. Linear adjustment as far as a lateral second adjustment position zf subsequently occurs.

FIG. 3 shows by way of example performances of such a solid state actuator arrangement in the case of an actuator 2 extended by means of extension elements 3*, as compared with the performance of a non-extended actuator 2. In this case, various second lengths l2 of the extension elements 3 used as examples for calculations are outlined. What can be seen clearly is a surprising optimization in performance with regard to the overall length of the solid state actuator arrangement, which results due to the overall effective length l1+l2 of the actuator 2 and of the extension element 3. It may therefore be stated that, by using an extension element 3 of this type, a reduction in the actuator volume of the actuator 2 is possible, without the effective performance in this case being lowered.

The performance of a bending actuator extended in this way can be calculated mathematically within the framework of Euler's bending theory. An arrangement according to FIG. 1 and FIG. 2 is in this case assumed once again, the structural width of such an arrangement extending perpendicularly to the sheet plane. At the left end of the arrangement, that is to say at x=0, the actuator 2 is mechanically fixed or fastened rigidly. The actuator 2 is characterized by its first length l1, its E-modulus or modulus of elasticity E1 and its geometric moment of inertia I1. An extension bar 3 is mechanically attached rigidly as the extension element 3 to its free second end portion 2f facing away from the fixing position x=0, that is to say at x=l1. The extension element 3 is characterized by its second length l2, its E-modulus E2 and its geometric moment of inertia I2. A mechanical tie-up of the extended bending actuator to elements to be driven the body 4, takes place at the right end, that is to say on the free second end portion 3f of the extension element 3, that is to say at x=l1+l2.

For an exact calculation of a power output of such a solid state actuator arrangement to the mechanical surroundings in the form of a load, such as, for example, the body 4, it is necessary to determine the force/path characteristic of the load. It is advantageous, for calculation to have a postulation with a load-independent value for the operating capability or performance of the actuator 2 with the extension element 3 for reasons of load-independent comparability. Such a load-independent value may be postulated by the product of a blocking force F and of a load-free deflection in the form of the second adjustment path zf, thus having the dimension of work performed.

An instructive illustration of a gain in performance by the extension is obtained in that a relation to the non-extended bending actuator as the actuator 2 is plotted over the length l2 of the extension element, divided by the bending length (l2/l1), in a graph. FIG. 3 is a corresponding graph with several curved profiles for typical material parameters and dimensions. The curve group illustrated results from a variation in the width or depth perpendicularly to the sheet plane and perpendicularly to the bending direction of the actuator 2, the width of the extension element 3 in the extension direction from the point of view of the actuator 2 being kept constant. Each curve of the curve group shows an unequivocal maximum which, according to first tests, gives cause to expect a gain in performance of approximately 16% to approximately 22%, depending on the actuator length, the length l2 of the attached bar or extension element 3 reaching from approximately 40% to approximately 70% of the length l1 of the actuator 2. A first arithmetic estimation of the gain in power output is around 33.33% in the case of an infinitely bend-resistant extension by means of an infinitely bend-resistant extension element 3.

FIG. 4 shows by way of example a sectional view of a second embodiment, essentially only differences from the first embodiment being described. Once again, a actuator 2 is fastened with its first fixed or fastened end portion 2e to a fastening device 1 in a bend-resistant and misplacement-proof manner. An extension element 3* is likewise fastened to the opposite second end portion 2f of the actuator 2. However, the extension element 3* does not extend in the continued linear longitudinal direction of the actuator 2 beyond the second end portion 2f of the latter, but, instead, with a first extension element portion 31 in a lateral direction. The lateral direction may in this case be selected basically as desired in relation to the bending direction of the actuator 2. The lateral directions of extent of the first extension element portion 31 in or opposite to the bending direction of the actuator 2 or at an angle of 90° laterally to the bending direction of the actuator 2 are preferred.

The first extension element portion 31 has adjoining it a second extension element portion 32 which, in the case of a relaxed rectilinearly actuator 2, runs parallel to a longitudinal extent of the actuator 2. The second extension element portion 32 runs parallel to the longitudinal extent of the actuator 2 in a direction toward drive 1. A second length l2 as the effective length only of the second extension element portion 32 is in this case longer than a first length l1 as the effective length of the actuator 2. Accordingly, the second extension element portion 32 runs laterally in the rearward direction beyond the fastening point of the actuator 2 on the fastening device 1 and therefore also parallel to a side wall of the fastening device 1.

In such an arrangement, the actual effective length of the solid state actuator arrangement is the value, in amount, of the length differences of the first length l1 as the effective longitudinal extent of the actuator 2, minus the second length l2 as the effective rearwardly directed length of the second extension element portion 32 as far as its free second end portion 3f. The free end portion 3f of the extension element 3* may again be used for adjusting a body 4.

FIG. 5 is a graph comparable to the graph according to FIG. 3 FIG. 5 outlines the performance profile of an arrangement according to FIG. 4.

In comparison with the first embodiment, the extension of the actuator 2 by the extension element 3 thus takes place inversely in the second embodiment, that is to say in the rearward direction, with the result that the overall length of the actuator 2 and of the passive extension element 3* is substantially reduced. The mechanical attachment of the extended bending actuator to elements to be driven or the body 4 therefore takes place at the left end in the drawing, that is to say on the free second end portion 3f of the extension element 3*, at x=l1−l2.

To calculate the power output of such a solid state actuator arrangement to the mechanical surroundings or load, once again the force/path characteristic of the load is considered. Again, the load-independent value is preferred for clear calculation purposes, for reasons of load-independent comparability. The load-independent value is again calculated by the product of a blocking force F and of a load-free deflection zf, and it has the dimension of work performed. A highly instructive illustration of the gain in performance due to the extension can be obtained in that the relation to the non-extended bending actuator or actuator 2 is plotted over the length of the extension by the extension element 3, divided by the bending length l2/l1, in a graph.

A corresponding graph is reproduced by way of example by the curve group illustrated in FIG. 5. The curve group is again obtained by a variation of the width or, in the relaxed longitudinal extent perpendicular to the bending direction length of the actuator 2, with the width kept constant or of the second length l2 of the extension element 3* parallel to the first length l1 of the actuator 2. Each curve of the curve group shows an unequivocal maximum value or extreme value which gives causes to expect a maximum gain performance of approximately 16% to approximately 24%, depending on the actuator width or depth, according to first considerations. In this case, the length of the attached bar or extension element in the region of its second extension element portion 32 reaches from approximately 150% to approximately 200% of the length l2 of the actuator 2. Once again, according to first calculations, the theoretical limit of the gain in power output is about 33.33% in the case of infinitely bend-resistant extension by means of the extension element 3*.

Such embodiments afford surprising advantages. By the actuator 2 being extended from its free moved second end portion 2*f* onward, it is possible, with the same amount of solid state actuator material, for example piezoelectric actuator material, being used, to achieve a performance which, according to first estimations, is increased up to theoretical 33% and in practice, according to first tests, to approximately 15% to 25%. As a result, a considerable potential for cost reduction can be made possible, since, instead of an increase in performance, a reduction in the material of the solid state actuator material can be carried out, in order to achieve the same effective performance of the overall solid state actuator arrangement.

With regard to the production of stepping motors and an example of a solid state actuator drive device in which such a solid state actuator can be used, there is no increased outlay in manufacturing terms when the plastic injection molding technique is employed for the extension element 3, 3*, since the extension element 3, 3*, and also the actuator attachment, can be injection-molded in the single operation.

Due the reducible length l1 of the piezoelectric material of the actuator 2 with a coefficient of thermal expansion deviating sharply from plastic, thermally induced detunings of a stepping drive in accordance with an embodiment of the invention can be reduced.

Furthermore, benefits in terms of construction space due to the compactness of the set-up when an arrangement according to the second embodiment is used, as compared with an arrangement of the first embodiment, can be achieved.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A solid state actuator arrangement, comprising:
an actuator configured as a solid state bending actuator, the actuator having a longitudinal extent along a first direction, the actuator comprising:
a first end portion; and
a second end portion longitudinally opposite the first end portion, the second end portion moveable between at least two positions as a result of the bending of the actuator;
a fastening device coupled to the first end portion of the actuator and configured to immovably fasten the first end portion of the actuator at a fastening point;
at least two terminals for applying a driver signal to the actuator to move the end portion between the at least two positions;
an extension element, the extension element comprising:
a first extension element portion fastened to the second end portion of the actuator, the first extension element portion extending substantially perpendicularly to the first direction; and
a second extension element portion adjoining the first extension element portion at a right angle, and extending, substantially perpendicularly from the first extension element portion, in a direction towards the fastening device, the second extension element being substantially parallel to the longitudinal extent of the actuator, and extending beyond the fastening point to a free end terminal portion of the second extension element portion at a rearward side of the fastening point relative to the second end of the actuator,
wherein an effective actuator length corresponds to a first length of a bendable portion of the actuator, minus a second length of the second extension element portion running parallel to the first length of the bendable portion of the actuator, and
wherein the actuator and the extension element cooperate to output a blocking force F at the free end terminal portion of the second extension element portion in a direction perpendicular to the first direction and parallel to the direction of extending of the first extension element portion.

2. The solid state actuator arrangement as claimed in claim 1, wherein a step-up ratio of the actuator arrangement is determined by 1 minus a quotient of double the second length divided by the first length.

3. The solid state actuator arrangement as claimed in claim 1, wherein the free end terminal portion of the second extension element portion is distally located from a location where the extension element is fastened to the free second end portion of the actuator and is configured to adjust a body with respect to its position in relation to the fastening device by application of the blocking force F.

4. The solid state actuator arrangement as claimed in claim 1, wherein the extension element is a passive extension element.

5. The solid state actuator arrangement as claimed in claim 1, wherein the extension element is a rigid extension element.

6. The solid state arrangement as claimed in claim 1, wherein the fastening device is configured to connect the actuator to one of a frame or a housing.

* * * * *